(12) United States Patent
Jiang

(10) Patent No.: US 10,418,766 B2
(45) Date of Patent: Sep. 17, 2019

(54) LAMINATED BUSBAR ASSEMBLY WITH SUBSTRATE

(71) Applicant: ZHUHAI ENPOWER ELECTRIC CO., LTD., Zhuhai (CN)

(72) Inventor: Guibin Jiang, Zhuhai (CN)

(73) Assignee: ZHUHAI ENPOWER ELECTRIC CO., LTD., Zhuhai (CN)

( * ) Notice: Subject to any disclaimer, the term of this patent is extended or adjusted under 35 U.S.C. 154(b) by 0 days.

(21) Appl. No.: 16/062,637

(22) PCT Filed: Apr. 5, 2017

(86) PCT No.: PCT/CN2017/079415
§ 371 (c)(1),
(2) Date: Jun. 15, 2018

(87) PCT Pub. No.: WO2017/177847
PCT Pub. Date: Oct. 19, 2017

(65) Prior Publication Data
US 2018/0375270 A1    Dec. 27, 2018

(30) Foreign Application Priority Data
Apr. 11, 2016  (CN) .......................... 2016 1 0223280

(51) Int. Cl.
*H01R 25/16* (2006.01)
*H01R 43/18* (2006.01)
(Continued)

(52) U.S. Cl.
CPC ........... *H01R 25/162* (2013.01); *H01R 25/16* (2013.01); *H01R 43/18* (2013.01); *H02B 1/205* (2013.01);
(Continued)

(58) Field of Classification Search
CPC ...... H01R 25/162; H01R 25/16; H01R 43/18; H01R 2201/10; H02B 1/205; H02M 7/003; H02P 23/00
(Continued)

(56) References Cited

U.S. PATENT DOCUMENTS 3,995,103 A * 11/1976 Gehrs ...................... H02B 1/21
174/72 B
4,867,696 A *  9/1989 Demler, Jr. ............ H02G 5/005
439/212
(Continued)

FOREIGN PATENT DOCUMENTS

CN      103647197 A      3/2014
CN      104022414 A      9/2014
(Continued)

*Primary Examiner* — Harshad C Patel
(74) *Attorney, Agent, or Firm* — Gokalp Bayramoglu

(57) ABSTRACT

A laminated busbar assembly includes a substrate, a positive current metal plate provided with a first pin, a negative current metal plate provided with a second pin, and an output current metal plate provided with a third pin. The substrate is provided with a pad hole group including a first pad hole, a second pad hole, and a third pad hole. The pad hole group is electrically connected to copper cladded on the substrate to form wirings. The positive current metal plate, the negative current metal plate, and the output current metal plate re all arranged on the first side of the substrate in a laminated manner. The first pin passes through first pad hole, the second pin passes through the second pad hole, and the third pin passes through the third pad hole.

18 Claims, 9 Drawing Sheets

(51) Int. Cl.
*H02P 23/00* (2016.01)
*H02B 1/20* (2006.01)
*H02M 7/00* (2006.01)

(52) U.S. Cl.
CPC ............ *H02M 7/003* (2013.01); *H02P 23/00* (2013.01); *H01R 2201/10* (2013.01)

(58) Field of Classification Search
USPC ......................................................... 439/214
See application file for complete search history.

(56) References Cited

U.S. PATENT DOCUMENTS

| | | | | |
|---|---|---|---|---|
| 5,038,257 A * | 8/1991 | Agabekov | ............ | F21V 19/0085 |
| | | | | 174/72 B |
| 5,055,059 A * | 10/1991 | Logstrup | .................. | H02B 1/21 |
| | | | | 439/214 |
| 7,207,187 B2 * | 4/2007 | Funahashi | ................ | F01C 21/10 |
| | | | | 62/113 |
| 7,580,247 B1 * | 8/2009 | Pearson | ................. | H02B 1/056 |
| | | | | 174/149 B |
| 8,723,038 B2 * | 5/2014 | Sakai | .................. | B60R 16/0238 |
| | | | | 174/68.2 |
| 10,131,296 B2 * | 11/2018 | Hara | ................... | B60R 16/0238 |

FOREIGN PATENT DOCUMENTS

| | | |
|---|---|---|
| CN | 204668666 U | 9/2015 |
| CN | 105680266 A | 6/2016 |
| CN | 205509180 U | 8/2016 |

* cited by examiner

LAMINATED BUSBAR ASSEMBLY WITH SUBSTRATE

CROSS REFERENCE TO RELATED APPLICATIONS

This application is the national phase entry of International Application PCT/CN2017/079415, filed on Apr. 5, 2017 which is based upon and claims priority to Chinese Patent Application No. 201610223280.1, filed on Apr. 11, 2016 the entire contents of which are incorporated herein by reference.

TECHNICAL FIELD

The present invention relates to the field of the electrical components, in particular to an alternating current (AC) motor controller and a laminated busbar assembly used in the battery operated electric vehicles, and manufacturing method of the laminated busbar assembly.

BACKGROUND

The battery operated electric vehicles have been widely used in the places with high environmental requirements such as tourist attractions etc. because they derive power without burning gasoline, and thus are environment friendly and cause low-pollution. Currently available battery operated electric vehicles are provided with an AC motor controller which is used to convert the direct current (DC) power output from the storage battery into three-phase AC power and drive the motor.

The printed circuit board (PCB) is indispensable and widely used in the electric field. The substrate is provided with some built-in wirings, and pad hole groups are arranged on the wirings. Different electronic elements are arranged and soldered to the pad holes to form various kinds of PCBs for different uses.

Taking the AC motor controller used in the battery electric vehicle as an example, the AC motor controller is used to convert the DC power output from the storage battery into three-phase AC power and drive the motor. An AC motor controller in the prior art includes a substrate. The substrate is provided with a first DC power supply terminal, a second DC power supply terminal, and a current output terminal. A plurality of first controllable switching elements are connected between the first DC power supply terminal and the current output terminal. A plurality of second controllable switching elements are connected between the current output terminal and the second DC power supply terminal. Other circuit elements of the circuit may also be arranged on the substrate according to the requirements of power supply. The first DC power supply terminal, the second DC power supply terminal, the current output terminal, and the substrate are electrically connected with each other by configuring copper-pour blocks. The first controllable switching element, the second controllable switching element, and the circuit elements of the circuit are electrically connected to the substrate by plugging in one by one and tin soldering while the IGBT is fixed to the substrate by bolts.

In the available installation and manufacturing process of substrates, because the insertion of elements is performed by plugging in the elements one by one, then proceeding with tin soldering, the insertion process is time-consuming and laborious, which makes it difficult to improve the production efficiency of the assembly and processing of substrates. Moreover, the extensibility of the busbar of the driving substrate is poor.

The first purpose of the present invention is to provide a laminated busbar assembly with high production efficiency, good expansibility, and wide application.

The second purpose of the present invention is to provide an AC motor controller with high degree of modularization and high production efficiency.

The third purpose of the present invention is to provide a manufacturing method of the laminated busbar assembly with high production efficiency.

In order to realize the first purpose of the present invention, the present invention provides a laminated busbar assembly which includes a substrate, a positive current metal plate, a negative current metal plate, and an output current metal plate. The substrate is provided with a pad hole group. A pad hole group is electrically connected to copper pour in the substrate to form the wirings. The pad hole group includes a first pad hole, a second pad hole, and a third pad hole. The positive current metal plate is provided with a first pin and the positive current metal plate is arranged on a first side of the substrate. The first pin passes through the first pad hole. A first connecting part is configured at the second side of the substrate by the first pin. The negative current metal plate is provided with a second pin and arranged on the first side of the substrate. The second pin passes through the second pad hole. A second connecting part is configured at the second side of the substrate by the second pin. The output current metal plate is provided with a third pin and arranged on the first side of the substrate. The third pin passes through the third pad hole. A third connecting part is configured at the second side of the substrate by the third pin. The substrate, the positive current metal plate, the negative current metal plate, and the output current metal plate are arranged in a laminated manner. The first connecting part is connected to the third connecting part. The second connecting part is connected to the third connecting part. The first connecting part is connected to the second connecting part.

Further, the laminated busbar assembly also includes an insulation layer group. The insulation layer group is arranged on one side of each of the substrate, the positive current metal plate, the negative current metal plate, and the output current metal plate.

Further, the laminated busbar assembly also includes an avoiding hole group. The avoiding hole group is arranged on the each of the positive current metal plate, the negative current metal plate, the output current metal plate, and the insulation layer group. The first pin, the second pin, and the third pin pass through the avoiding hole group.

Further, the laminated busbar assembly also includes an insulation plate. The insulation plate, the substrate, the positive current metal plate, the negative current metal plate, the output current metal plate, and the insulation layer group are arranged in a laminated manner. The insulation plate is located at the outermost end away from the substrate. The avoiding hole group is also configured on the insulation plate.

Further, the first pin, the second pin, and the third pin are configured on one side of the avoiding hole group.

Further, the laminated busbar assembly also includes a positive bus plate. The positive bus plate is provided with a fourth pin. The fourth pin passes through the first pad hole and adjoins the first connecting part. The laminated busbar assembly also includes a negative bus plate. The negative bus plate is provided with a fifth pin. The fifth pin passes through the second pad hole and adjoins the second connecting part. The laminated busbar assembly also includes an output bus plate. The output bus plate is provided with a sixth pin. The sixth pin passes through the third pad hole and adjoins the third connecting part.

Further, the first pin and the first pad hole are configured in an interference fit. The second pin and the second pad hole are configured in an interference fit. The third pin and the third pad hole are configured in an interference fit.

Further, the positive bus plate is provided with first protrusion portions between the fourth pins. The negative bus plate is provided with second protrusion portions between the fifth pins. The output bus plate is provided with third protrusion portions between the sixth pins.

In order to realize the second purpose of the present invention, the present invention provides an AC motor controller which includes a laminated busbar assembly, a controllable switching element assembly, and a filter element assembly. The laminated busbar assembly includes a substrate which is provided with a pad hole group. A pad hole group is electrically connected to copper pour in the substrate to form the wirings. The pad hole group includes a first pad hole, a second pad hole, and a third pad hole, characterized in that the positive current metal plate is provided with a first pin. The positive current metal plate is arranged on a first side of the substrate. The first pin passes through the first pad hole. A first connecting part is configured at the second side of the substrate by the first pin. The negative current metal plate is provided with a second pin. The negative current metal plate is arranged on the first side of the substrate. The second pin passes through the second pad hole. A second connecting part is configured as the second side of the substrate by the second pin. The output current metal plate is provided with a third pin. The output current metal plate is arranged on the first side of the substrate. The third pin passes through the third pad hole. A third connecting part is configured at the second side of the substrate by the third pin. The substrate, the positive current metal plate, the negative current metal plate, and the output current metal plate are arranged in a laminated manner. The first connecting part is connected to the third connecting part. The second connecting part is connected to the third connecting part. The first connecting part is connected to the second connecting part. A controllable switching element assembly is connected between the first connecting part and the third connecting part. A controllable switching element assembly is connected between the second connecting part and the third connecting part. The filter element assembly is connected between the first connecting part and the second connecting part.

In order to realize the third purpose of the present invention, the present invention provides a manufacturing method of the laminated busbar assembly which includes a substrate, a positive current metal plate, a negative current metal plate, and an output current metal plate. The substrate is provided with a pad hole group. The pad hole group is electrically connected to copper pour in the substrate to form the wirings. The pad hole group includes a first pad hole, a second pad hole, and a third pad hole. The positive current metal plate is provided with a first pin. The positive current metal plate is arranged on a first side of the substrate. The first pin passes through the first pad hole. A first connecting part is configured at the second side of the substrate by the first pin. The negative current metal plate is provided with a second pin. The negative current metal plate is arranged on the first side of the substrate. The second pin passes through the second pad hole. A second connecting part is configured at the second side of the substrate and is provided with corresponding to the second pin. The output current metal plate is provided with a third pin. The output current metal plate is arranged on the first side of the substrate. The third pin passes through the third pad hole. A third connecting part is configured at the second side of the substrate by the third pin. The substrate, the positive current metal plate, the negative current metal plate, and the output current metal plate are arranged in a laminated manner. The first connecting part is connected to the third connecting part. The second connecting part is connected to the third connecting part. The first connecting part is connected to the second connecting part. The present invention is characterized in that the manufacturing method of the laminated busbar assembly includes: a positive current metal plate laminated on the substrate, wherein the first pin is inserted into the first pad hole; a negative current metal plate laminated on the positive current metal plate, wherein the second pin is inserted into the second pad hole; the output current metal plate laminated on the negative current metal plate, wherein the third pin is inserted into the third pad hole. The reflow soldering is simultaneously performed between the first pin and the first pad hole, the second pin and the second pad hole, the third pin and the third pad hole.

The present invention provides an AC motor controller, a laminated busbar assembly and a manufacturing method thereof. The first pin of the positive current metal plate, the second pin of the negative current metal plate, and the third pin of the output current metal plate pass through the pad hole group on the substrate from the same side. The second side of the substrate is provided with a first connecting part, a second connecting part, and a third connecting part, respectively. The substrate, the positive current metal plate, the negative current metal plate, and the output current metal plate are arranged in a laminated manner. Therefore, in the assembly process of the electronic control device based on the laminated busbar assembly, a plurality of different circuit elements of the circuit, the positive current metal plates, the negative current metal plates, and the output current metal plates can be laminated and compressed at the same time, and respective preset pin can pass through the respective preset pad hole group of the substrate at the same time, then the assembly and soldering of electronic control device based on laminated busbar assembly can be completed by a one-off reflow soldering process. The laminated busbar not only can provide a network with large current, but also can be mass produced using automation equipment, thereby greatly improving the production efficiency, and a strong expansibility and wide use can be realized.

In addition, the insulation layer group may be a separate insulation piece or an insulation coating covering on the substrate, positive current metal plate, negative current metal plate, or output current metal plate. Because the substrate, the positive current metal plate, the negative current metal plate, and the output current metal plate all have electrical conductivity, the breakdown by current and short out of circuit between adjacent plates can be effectively avoided by providing the insulation layer group on one side of each of the substrate, the positive current metal plate, the negative current metal plate, and the output current metal plate. Meanwhile, the external elements of circuit element can be prevented from breakdown and short circuit, thereby protecting the circuit. Moreover, the intervals of plates do not need to be controlled in the compressing process, thereby improving the production efficiency.

Additionally, by configuring the avoiding hole group, the first pin, the second pin, or the third pin directly passes through the positive current metal plate, the negative current metal plate, or the output current metal plate before passing through the substrate without detour, so that the wiring of circuit is more convenient. Besides, the avoiding hole has a function of positioning the pin in a sense, thereby improving the stability in the process of assembling and compressing and the yield, effectively.

In addition, the insulation plate can prevent the external circuit element, the positive current metal plate, the negative current metal plate, and the output current metal plate from being broken down and shorted out, thus avoiding damages to the circuit, and the insulation plate has a pressure-proof and protection function for the laminated busbar assembly. The pins of the external circuit element can pass through the avoiding hole group of the insulation plate directly, then pass through the avoiding hole groups of the positive current metal plate, the negative current metal plate, the output current metal plate, and the insulation layer group, and finally pass through the pad hole group of the substrate to form the connection of circuit.

Moreover, taking the positive current metal plate as an example, in the production process of the positive current metal plate, the holes of positive current metal plate are formed holethrough the process of stamping or milling, drilling and so on. The protrusion portion of the edge contour of the hole extends toward the hole. The first pin is formed by bending the protrusion portion of the edge contour. In the process of stamping or milling and drilling, the holes are directly configured as avoiding holes, so another trepanning process is not needed and the production efficiency is effectively improved.

In addition, the positive bus plate and the negative bus plate serve as the current input terminal. The output bus plate serves as the current output terminal. The positive bus plate, the negative bus plate, and the output bus plate can pass through the pad hole to proceed tin soldering with the substrate. That is to say, when the lamination, compressing, and installation of the laminated busbar assembly are performed, the positive bus plate, the negative bus plate, and the output bus plate can be laminated and compressed concurrently, so the process is optimized and the efficiency is improved.

Further, as a result of the interference fit between the first pin, the second pin, the third pin and the pad hole group, the positions among the plates are relatively fixed after the compressing and assembling process, and the relative position between the first pin, the second pin, the third pin and the pad hole group is also fixed, so the processing efficiency of the tin soldering in the subsequent step, the stability, and the yield are improved.

Further, taking the positive bus plate as an example, when the fourth pin of the positive bus plate is in interference fit with the pad hole group of the substrate, each of the metal plates between the positive bus plate and the substrate are compressed and fixed by the first protrusion portion, so the structure of the laminated busbar assembly is more compact and stable, and the occurrence of rosin joint can be avoided.

Further, the first pin of the positive current metal plate, the second pin of the negative current metal plate, and the third pin of the output current metal plate pass through the pad hole group of the substrate from the same side, and form the first connecting part, the second connecting part, and the third connecting part, respectively. The substrate, the positive current metal plate, the negative current metal plate, and the output current metal plate are arranged in a laminated manner. By doing so, in the assembling process of the electronic control device based on the laminated busbar assembly, a plurality of different circuit elements, the positive current metal plate, the negative current metal plate, and the output current metal plate can be compressed concurrently, so the respective pins can pass through the pad hole group of the substrate concurrently, then the assembling and soldering of electronic control device based on laminated busbar assembly is completed by a one-off tin soldering process. Therefore, the laminated busbar assembly has a strong expansibility, greatly improves the production efficiency, and is widely used.

Further, merely a lamination of the positive current metal plate, the negative current metal plate, and the output current metal plate is required in the manufacture of the laminated busbar assembly, and the corresponding first pins, second pins or third pins are concurrently inserted into the pad hole group of the substrate, then the one-off reflow soldering is performed. Therefore, the manufacturing steps are greatly reduced compared with the manufacturing steps of the busbar available now, so the production efficiency is greatly improved and the laminated busbar assembly can be widely used.

The present invention will be described in detail below with reference to the drawings and embodiments.

DETAILED DESCRIPTION OF THE EMBODIMENTS

Embodiment of an AC Motor Controller

Figure 1:
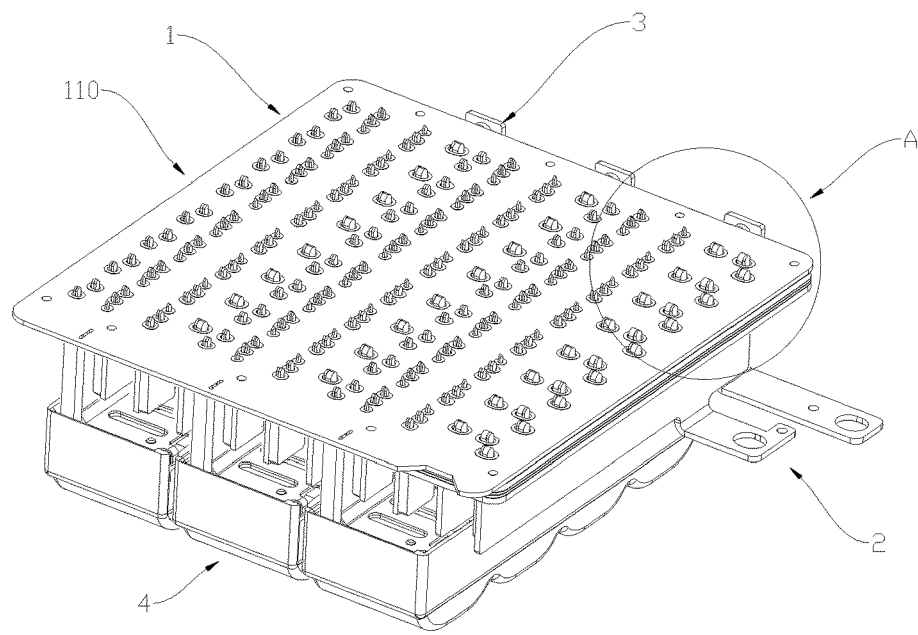
FIG. 1 is a structural view of an AC motor controller according to an embodiment of the present invention.

FIG. 1 shows a structural view of an AC motor controller. The AC motor controller includes a laminated busbar assembly 1, an input bus plate 2, an output bus plate 3, and a circuit element 4. The function of the AC motor controller is to convert the DC current input into an AC output through a controllable switching element such as power transistor, so as to supply power to the drive motor.

The difference between the laminated busbar assembly 1 of the embodiment and the existing busbar is that the laminated busbar assembly is formed by laminating multiple layers of metal plates, the pins of respective metal plate pass through avoiding holes of another metal plate and finally reach the position of a pad hole group of the substrate.

Figure 2:
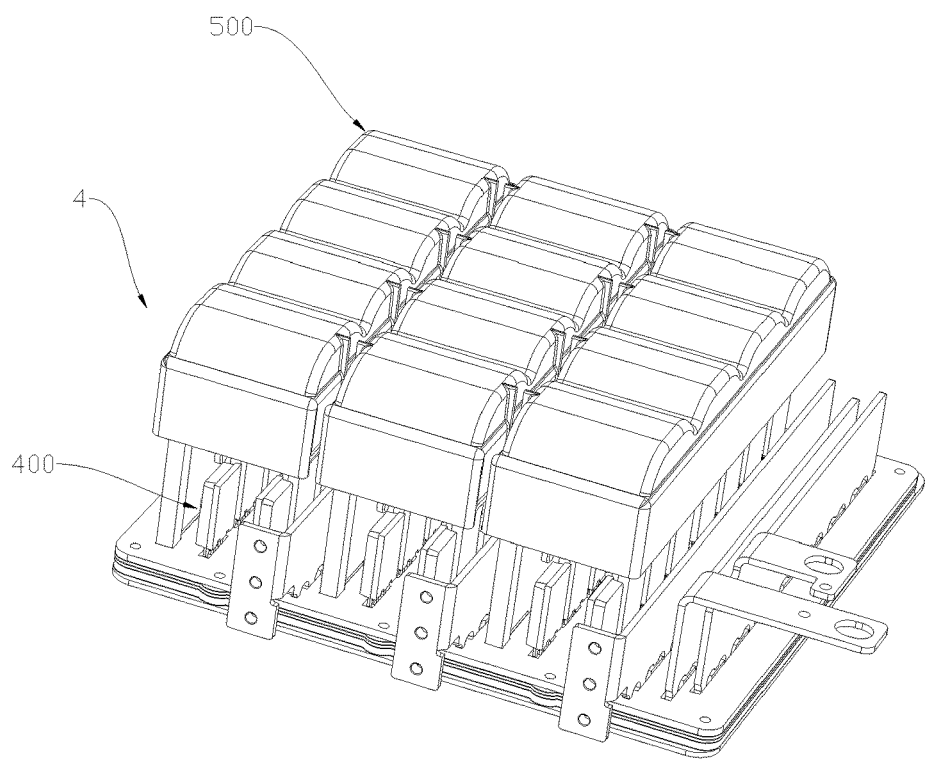
FIG. 2 is a structural view from another angle of the AC motor controller according to an embodiment of the present invention.

FIG. 2 shows a structural view from another angle of the AC motor controller. The circuit element 4 includes a combined power transistor module 400 and a capacitor array 500. The combined power transistor module 400 is a controllable switching element module. The capacitor array 500 is a filter element module. After the laminated busbar assembly 1 is assembled, the corresponding pins of the combined power transistor module 400 and the corresponding pins of the capacitor array 500 may pass through the avoiding hole group of the laminated busbar assembly 1, and eventually pass through the pad hole group of the substrate to realize the connections of the circuit.

Figure 3:
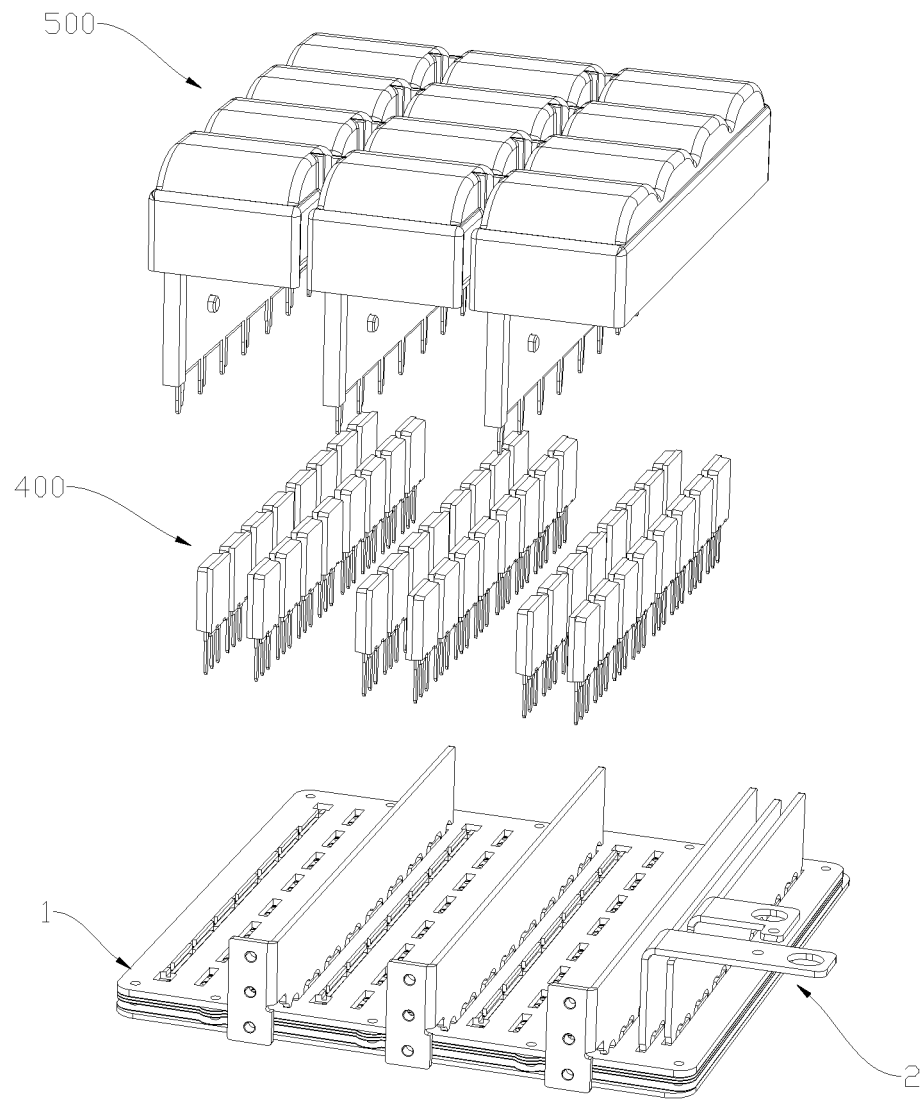
FIG. 3 is an exploded view showing the structure of an AC motor controller according to an embodiment of the present invention.

As shown in FIG. 3, similar to the combined power transistor module 400 and the capacitor array 500, the corresponding hard parts of the input bus plate 2 and the output bus plate 3 pass through the avoiding holes of the laminated busbar assembly 1 and reach the pad hole group of the substrate to realize the connections of the circuit.

Figure 4:
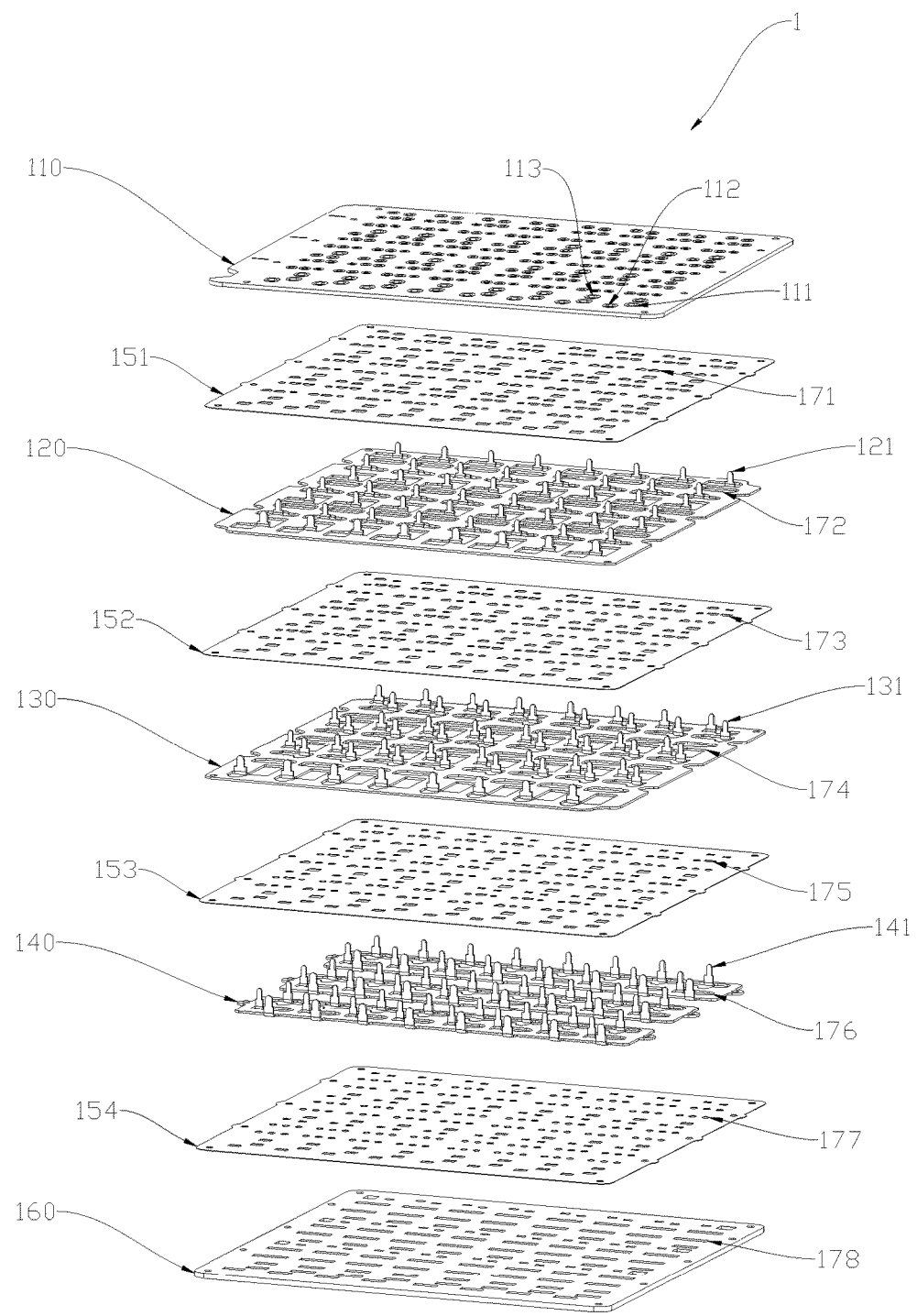
FIG. 4 is an exploded view showing the structure of a laminated busbar assembly according to an embodiment of the present invention.

FIG. 4 is an exploded view showing the structure of the laminated busbar assembly. The substrate 110 is the base of the laminated busbar assembly. Pad hole groups are arranged on the substrate 110. The pad hole groups are connected to each other through copper pour in the substrate to form electrical connection of the circuit. The pad hole groups include a plurality of first pad holes 111, a plurality of second pad holes 112, and a plurality of third pad holes 113. The plurality of first pad holes 111, the plurality of second pad holes 112, and the plurality of third pad holes 113 are evenly and straightly arranged on the substrate 110, so it is easy to position a plurality of modularized elements or the pins of the current bus plate in the insertion, and more positions are provided for elements to be soldered.

Taking the tin soldering working surface of the pad of the substrate 110 as a reference top surface, the first side (below the substrate) of the substrate 110 from top to bottom is successively laminated with first insulation piece 151, positive current metal plate 120, second insulation piece 152, negative current metal plate 130, third insulation piece 153, output current metal plate 140, fourth insulation piece 154, and insulation plate 160. In the embodiment, first insulation piece 151, the second insulation piece 152, third insulation piece 153, and fourth insulation piece 154 form the insulation layer group of the present embodiment. The insulation layer group, the positive current metal plate 120, the negative current metal plate 130, the output current metal plate 140, and the insulation plate 160 are correspondingly provided with a plurality of avoiding holes. The avoiding holes on each plate and the insulation layer group form the avoiding hole group of the present embodiment. Optionally, the insulation layer group may also be an insulation clad layer plated on the positive current metal plate 120, the negative current metal plate 130, and/or the output current metal plate 140.

A plurality of first pins 121 are arranged on the positive current metal plate 120. The plurality of first pins 121 are arranged perpendicular to the positive current metal plate 120. All of the first pins 121 respectively pass through first avoiding hole 171 of the first insulation piece 151 above them, and then continue to pass through the first pad hole 111 of the substrate 110. After the first pins 121 pass through the first pad holes 111 and reach the second side of the substrate 110. A first connecting part is configured at the second side of the substrate by the first pin 121.

A plurality of second pins 131 are arranged on the negative current metal plate 130 and are perpendicularly upward to the negative current metal plate 130. All of the second pins 131 successively pass through third avoiding holes 173 of second insulation piece 152, second avoiding holes 172 of the positive current metal plate 120, and first avoiding holes 171 of the first insulation piece 151 above the second pins, and finally pass through the second pad holes 112 of the substrate 110. The second pin 131 passes through the second pad hole 112 and reaches the second side of the substrate 110. A second connecting part is configured at the second side of the substrate by the second pin 131.

A plurality of third pins 141 are arranged on the output current metal plate 140 and perpendicularly upward to the output current metal plate 140. All of the third pins 141 successively pass through the fifth avoiding holes 175 of the third insulation piece 153, the fourth avoiding holes 174 of the negative current metal plate 130, the third avoiding holes 173 of the second insulation piece 152, the second avoiding holes 172 of the positive current metal plate 120, the first avoiding holes 171 of the first insulation piece 151 above the third pins 141, and finally pass through the third pad holes 113 of the substrate 110. The third pin 141 passes through the third pad hole 113 and reach the second side of the substrate 110. A third connecting part is configured at the second side of the substrate by the third pin 141.

Pieces made of insulation materials are arranged between the positive current metal plate 120, the negative current metal plate 130, and the output current metal plate 140, so pairwise electrical conduction among them which may destroy the arrangement of the circuit can be prevented. The first connecting part of the first pin 121, the second connecting part of the second pin 131, and the third connecting part of the third pin 141 may be connected to each other through an intermediate substance such as a power transistor, a capacitor etc.

The fourth insulation piece 154 and the insulation plate 160 are successively arranged below the output current metal plate 140. Seventh avoiding holes 177 are arranged on the fourth insulation piece 154. Eighth avoiding holes 178 are arranged on the insulation plate 160. Similarly, the power transistor element and the filter capacitor etc. may be arranged at the lower side of the insulation plate 160. The pins of the power transistor element and the filter capacitor element may pass through the avoiding hole group and finally reach the pad hole group of the substrate 110 to be electrically connected to the first connecting part of the first pin 111, the second connecting part of the second pin 112, or third connecting part of third pin 113.

Besides, the pins of the metal plate are arranged on a side of the corresponding avoiding holes. Taking the positive current metal plate 120 as an example, the processing procedure of first pin 121 is as follows. First, a machine tool is used to perform the process of material removing, such as a stamping process or a milling, drilling process etc. so as to form a through hole on the positive current metal plate 120. The edge of the through hole is partially same as the contour of the first pin 121. Then the edge of the contour is bent to protrude from the positive current metal plate to form the first pin 121. If the contour of the second avoiding hole 172 is generated while the contour of the first pin 121 is processed in the material removing procedure, the additional processing procedure of the avoiding hole may be saved.

Figure 5:
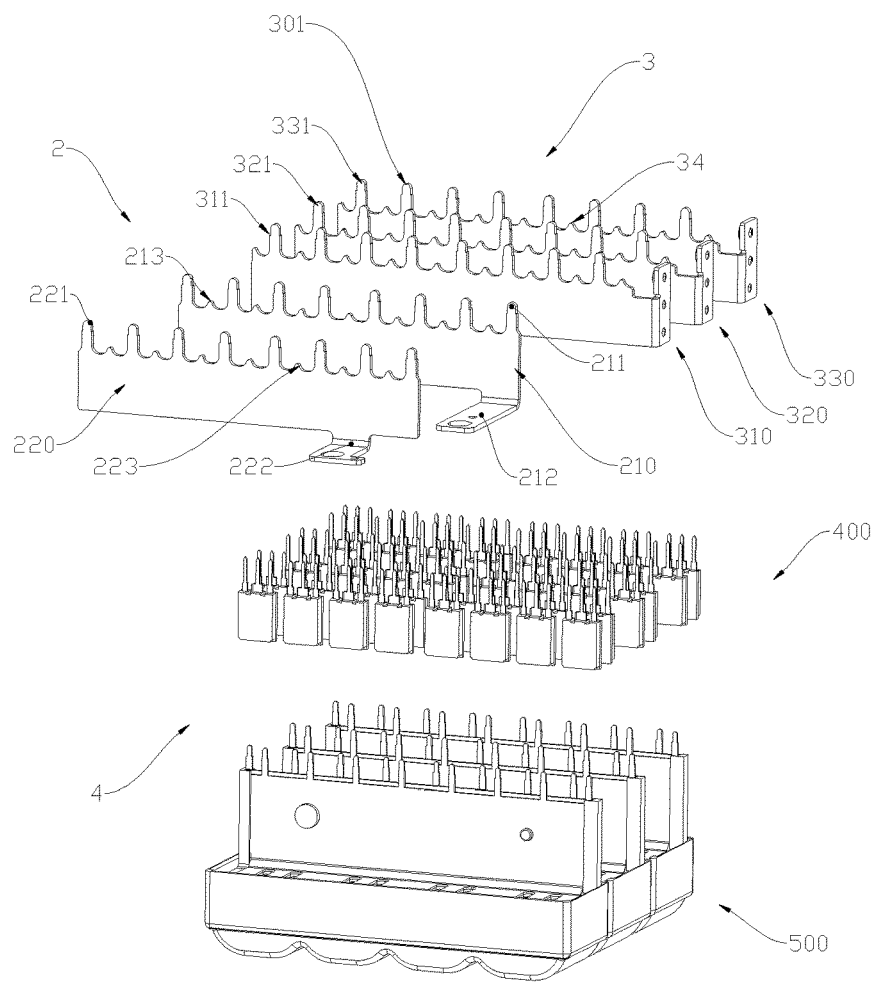
FIG. 5 is an exploded view showing the structure of a part of components of the AC motor controller according to an embodiment of the present invention.

FIG. 5 is an exploded view showing the structure of the components of the AC motor controller excluding laminated busbar assembly 1.

The input bus plate 2 includes a positive bus plate 210 and a negative bus plate 220. In the present embodiment, a metal copper busbar may be used as the bus plate.

An upper part of the positive bus plate 210 is provided with fourth pins 211 aligned in a row. A lower part of the positive bus plate 210 is provided with a positive input terminal 212. An upper part of the negative bus plate 220 is provided with fifth pins 221 aligned in a row. The lower part of the negative bus plate 220 is provided with a negative input terminal 222. The positive input terminal 212 and the negative input terminal 222 are the input terminals of direct current (DC). The input terminal is electrically connected to the battery and receives power from the battery.

The output bus plate 3 includes U-phase output bus plate 310, V-phase output bus plate 320, and W-phase output bus plate 330. The sixth pin 301 of the output bus plate 3 includes U-phase sixth pin 311, V-phase sixth pin 321 and W-phase sixth pin 331.

A first protrusion portion 213 is arranged between every adjacent fourth pins 211 on the positive bus plate 210. A second protrusion portion 223 is arranged between every adjacent fifth pins 221 on the negative bus plate 220. A third protrusion portion 34 is arranged between every adjacent sixth pins 301 on the output bus plate 3. The first protrusion portion 213, the second protrusion portion 223, and the third protrusion portion 34 play a role of positioning among the plates between the input bus plate 2, the output bus plate 3, and the substrate 110, so the situation where misplacement of pins is caused due to warpage of plates and thus resulting in rosin joint of the pad hole group in the soldering can be prevented.

An upper part of U-phase output bus plate 310 is provided with U-phase sixth pins 311 aligned in a row, and a U-phase bus terminal (not shown) is connected to a side of the U-phase output bus plate 310. An upper part of V-phase output bus plate 320 is provided with V-phase sixth pins 321 aligned in a row, and a V-phase bus terminal (not shown) is connected to a side of the V-phase output bus plate 320. An upper part of W-phase output bus plate 330 is provided with W-phase sixth pins 331 aligned in a row, and a W-phase bus terminal (not shown) is connected to a side of the W-phase output bus plate 330. The U-phase bus terminal, the V-phase bus terminal, and the W-phase bus terminal are the output terminals of three-phase AC electricity. The output terminals are electrically connected to the motor.

The circuit element 4 includes three combined power transistor modules 400, three capacitor arrays 500, and three control modules (not shown). The control modules may be arranged on a control circuit board. The control circuit board is provided with corresponding pins. Then, the pins of the control circuit board successively pass through the avoiding hole group and the pad hole group and reach the second side of the substrate 110. The pins of the control module are electrically connected to the gate terminal of the control end of the combined power transistor module 400, so the switching control of the combined power transistor module 400 by the control module is realized.

Figure 6:
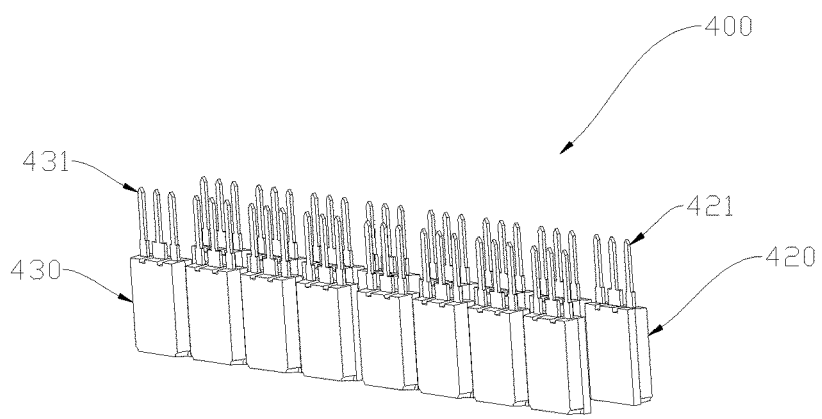
FIG. 6 is an exploded view showing the structure of a combined power transistor assembly in the AC motor controller according to an embodiment of the present invention.

FIG. 6 is an exploded view showing the structure of the combined power transistor module 400. The combined power transistor module 400 includes a plurality of first power transistors 420 and a plurality of second power transistors 430. An upper end of the first power transistor 420 is provided with seventh pin 421. An upper end of the second power transistor 430 is provided with eighth pin 431.

The number of the first power transistor 420 and the second power transistor 430 on the combined power transistor module 400 may be increased or decreased according to the demands of the AC motor controller, so the operation of modularized assembly of the first power transistor 420 and the second power transistor 430 may be realized. The seventh pin 421 and eighth pin 431 of the assembled combined power transistor module 400 are all located vertically upward, so the pins may pass through the avoiding hole group and the substrate below the laminated busbar assembly 1 (shown in FIG. 4) and then reach the second side of the substrate to be electrically connected to the first connecting part, the second connecting part, or the third connecting part.

Figure 7:
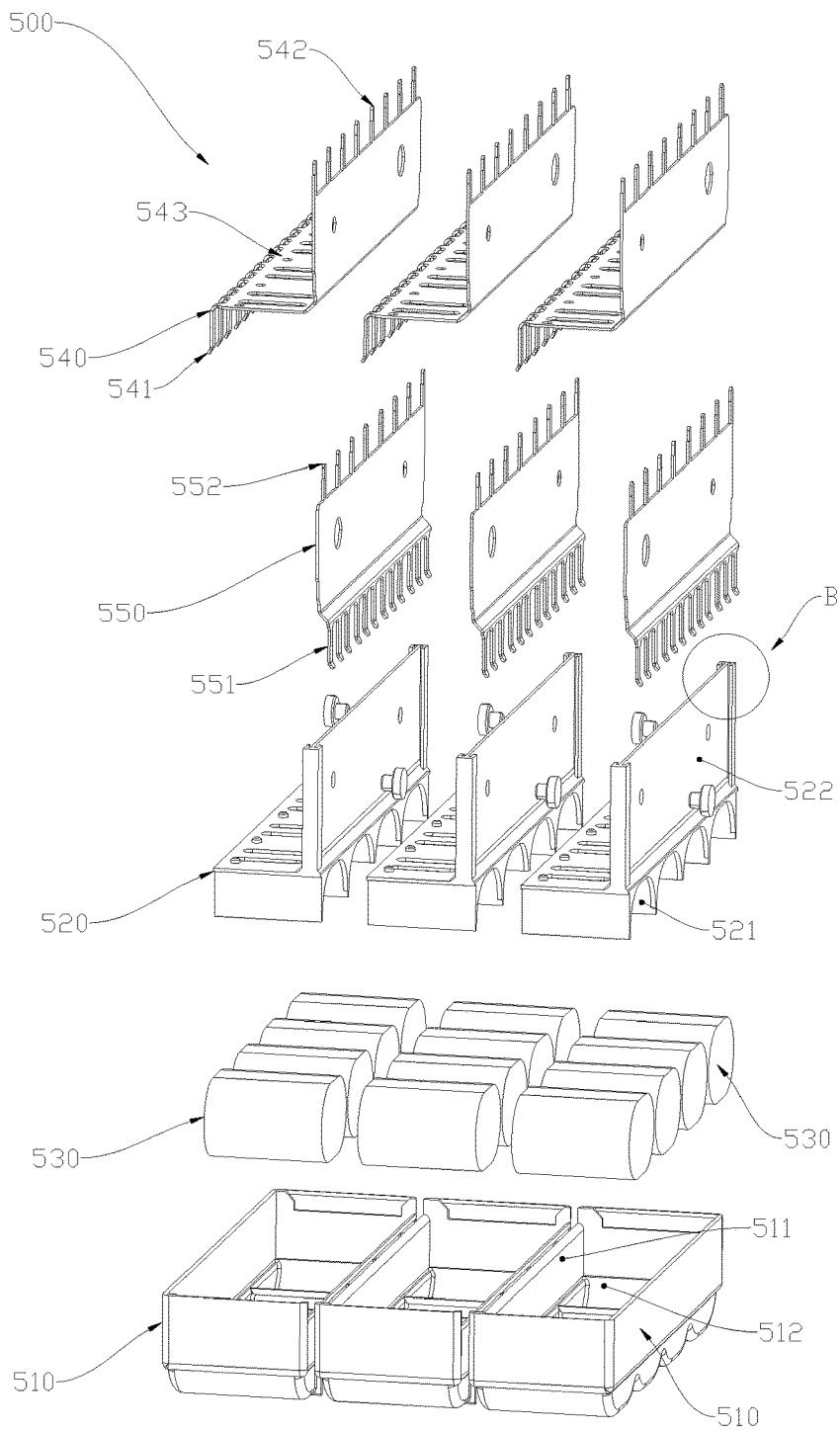
FIG. 7 is an exploded view showing the structure of a capacitor array according to an embodiment of the present invention.

FIG. 7 is an exploded view showing the structure of the capacitor array 500. The capacitor array 500 includes a plurality of capacitor covers 510, a plurality of capacitor holders 520, a plurality of capacitors 530, a plurality of positive copper plates 540, and a plurality of negative copper plates 550. The positive copper plate 540 is a first connector for connecting the positive terminal of the capacitor 530. The negative copper plate 550 is a second connector for connecting the negative terminal of the capacitor 530.

The capacitor holder 520 is designed for mounting the capacitor 530 and an easier fixation of the positive copper plate 540 and the negative copper plate 550. The capacitor holder 520 includes a plurality of capacitor grooves 521 and transverse plate 522 located on the back side of the plurality of capacitor grooves 521.

The capacitor holder 520 of this embodiment is provided with four capacitor grooves 521. The capacitor grooves 521 are used to place the capacitor 530. Four capacitor grooves 521 are arranged in a column. The groove surface of the capacitor groove 521 is an arc surface. The radian of the groove surface is designed according to surface curvature of the capacitor 530. Therefore, not only the matching accuracy between the capacitor holder 520 and the capacitor cover 510 is effectively improved, but the arc-shaped baffle formed between the capacitor grooves 521 can also effectively prevent the contact of the capacitors 530 in the same column.

The transverse plate 522 in the present embodiment is arranged on the second side (a side near the side mounted with the negative copper plate 550) of the end surface of the back side of the capacitor groove 521.

Figure 9:
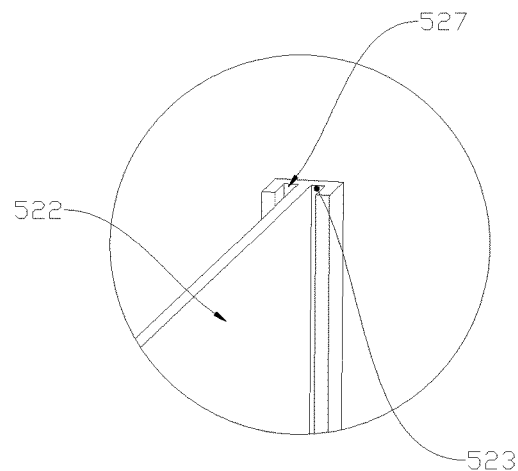
FIG. 9 is an enlarged view of B in FIG. 7.
Figure 10:
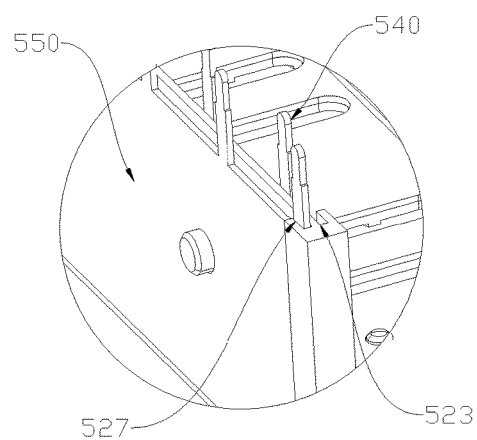
FIG. 10 is an enlarged view showing the connection relationship of a positive copper plate, a negative copper plate, and a transverse plate in the capacitor array according to an embodiment of the present invention.

As shown in FIG. 7, FIG. 9 and FIG. 10, the first side and the second side of the transverse plate 522 are respectively provided with a first mounting groove 523 and a second mounting groove 527. The first mounting groove 523 and the second mounting groove 527 are side engaging grooves. The plate-shape positive copper plate 540 and negative copper plate 550 are respectively engaged on the first mounting groove 523 and the second mounting groove 527, so that the positive copper plate 540 and the negative copper plate 550 are fixed in the horizontal direction.

A connecting flat surface is located between the transverse plate 522 and the capacitor groove 521 of the capacitor holder 520. The connecting flat surface is an end surface of the back side of the capacitor groove 521. The connecting flat surface is provided with five positioning pins 525 arranged side by side and a plurality of second heat dissipation holes 526. The second dissipation hole 526 allows the capacitor groove 521 to communicate with the connecting flat surface.

Figure 11:
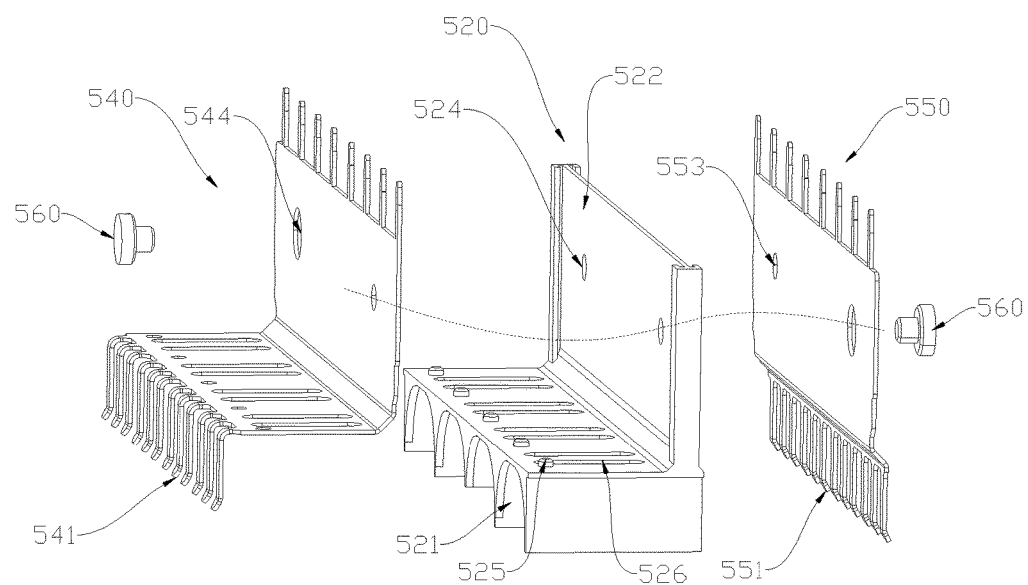
FIG. 11 is a structural view of a part of components of the capacitor array in the AC motor controller according to an embodiment of the present invention.

As shown in FIG. 7 and FIG. 11, a pair of symmetrically arranged first fixing holes 524 are arranged in the middle part of the transverse plate 522. The first fixing holes 524 cooperate with the positive copper plate 540 and the negative copper plate 550 to realize the vertical fixation of the positive copper plate 540 and the negative copper plate 550.

As shown in FIG. 7, the capacitor cover 510 is a seat for placing a plurality of capacitors 530 in a column of capacitor holder 520. The capacitor cover 510 is made of an insulation material. The capacitor cover 510 in this embodiment is provided with capacitor seat 512 for placing a single capacitor 530. Each column includes four capacitor seats 512 for accommodating four capacitors 530.

The bottom part of the capacitor seat 512 has an arc-shaped bottom surface. The specific radian is configured according to the surface curvature of the capacitor 530. A predetermined space is configured between each of the capacitor seats 512 to effectively prevent two adjacent capacitors 530 in the same column from contacting each other. Two sides of each capacitor holder 520 are provided with separating plates 511. The separating plate 511 effectively partitions the capacitor seats 512 of the adjacent capacitor holders 520, so the capacitors 530 in adjacent columns can be prevented from contacting each other. Also, the adjacent positive copper plate 540 and negative copper plate 550 can be prevented from being breakdown and shorted out, thereby preventing any damage to the circuit.

Figure 8:
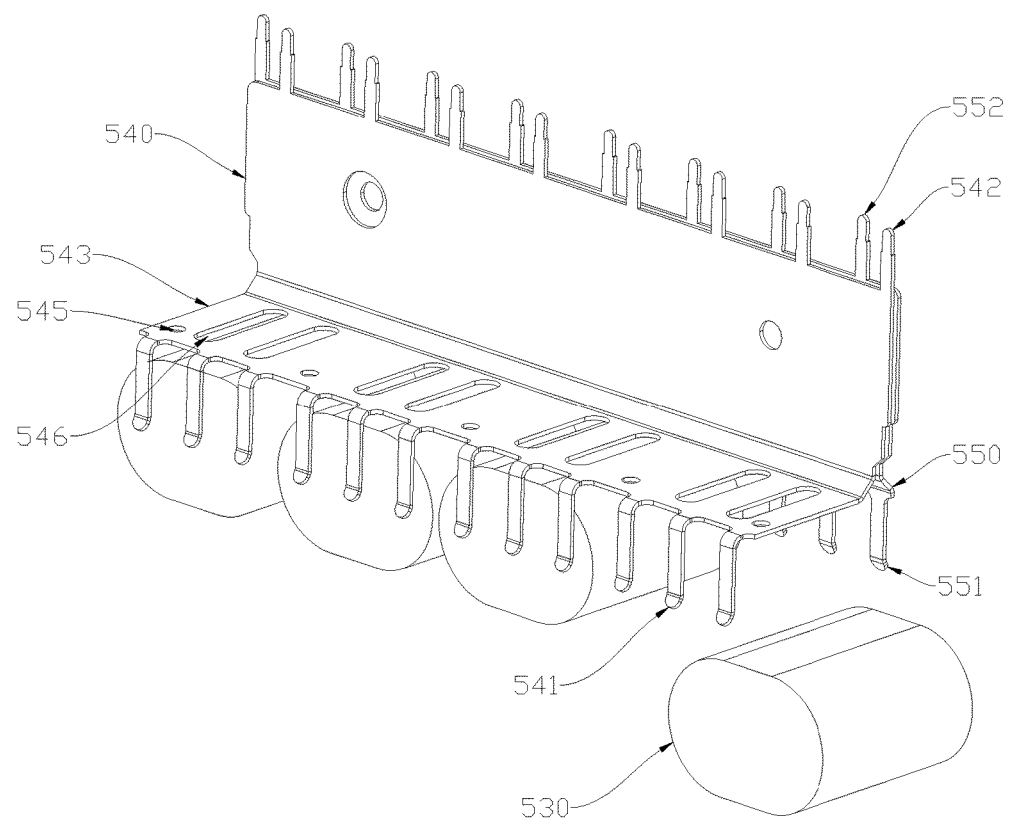
FIG. 8 is a structural view of a part of components of the capacitor array according to an embodiment of the present invention.

Referring to FIG. 7 and FIG. 8, FIG. 8 is a connection diagram showing the relation of the capacitors 530. The first end of the positive copper plate 540 is a plurality of first contact terminals 541 aligned in a row. Since the transverse plate 522 on the capacitor holder 520 is located the side close to the negative copper plate 550, and the positive copper plate 540 should be fixed on the transverse plate 522, a transverse extension portion 543 is arranged between the positive copper plate 540 and the first contact terminal 541 to allow the first contact terminal 541 to extend to the positive end of the capacitor 530. A group of first heat dissipation holes 546 is arranged on the transverse extension portion 543. A fourth location hole 545 is further arranged on the transverse extension portion 543. The first heat dissipation holes 546 and the fourth location holes are all through holes.

The second end of the positive copper plate 540 is a plurality of first pole pins 542 arranged in a column. The first pole pin 542 are located vertically and upward to realize the connection with the laminated busbar assembly 1 (shown in FIG. 4).

The first end of the negative copper plate 550 is provided with a plurality of second contact terminals 551 aligned in a row. The second end of the negative copper plate 550 is provided with a plurality of second pole pins 552 located vertically and upward. A plurality of second pole pins 552 are arranged in array. The second pole pins 552 are used to realize the connection with the laminated busbar assembly 1 (shown in FIG. 2).

A plurality of capacitors 530 may be connected between one positive copper plate 540 and one negative copper plate 550 at the same time, which means that the positive terminals of the plurality of connected capacitors 530 are connected with each other, and so do the negative terminals, namely, the plurality of capacitors 530 are connected in parallel. In other words, the capacitors 530 in the same column of the capacitor cap 510 are connected in parallel. In this embodiment, each column of the capacitor cap 510 is provided with four capacitor seats 512, i.e. the number of capacitors connected in parallel in each column of capacitor seats may be 0 to 4, which is determined according to the conditions.

Referring to FIG. 8, FIG. 9, FIG. 10, and FIG. 11, FIG. 9 is a partial enlarged view of the transverse plate 522 of FIG. 7, and FIG. 11 is a diagram showing the mounting relations of the positive copper plate 540, the negative copper plate 550, and the capacitor holder 520. The positive copper plate 540 and the negative copper plate 550 are engaged with the first mounting groove 523 and the second mounting groove 527 at both ends of the transverse plate 522, so that the positive copper plate 540 and the negative copper plate 550 are fixed on the transverse plate 522. Further, the positive copper plate 540 is provided with a first location hole 544, the negative copper plate 550 is provided with a second location hole 553, and the transverse plate is provided with a third location hole 524. A locating pin 560 passes through the first location hole 544, the second location hole 553, and the third location hole 524 to stabilize the association among the positive copper plate 540, the negative copper plate 550, and the capacitor holder 520 in a further step. Furthermore, a plurality of fourth location holes 545 of the positive copper plate 540 are fitted with the positioning pins 525 of the capacitor holder 520 in a shaft-hole match for location, so the positive copper plate 540 is further fitted and located on the capacitor holder 520.

After the positive copper plate 540 and the negative copper plate 550 are mounted on the capacitor holder 520, the first contact terminal 541 is located at the first end of the capacitor groove 521, the second contact terminal 551 is located at the second end of the capacitor groove 521.

When the capacitor holder 520 is assembled with the capacitor cover 510, the capacitor groove 521 at the first end of the capacitor holder 520 is embedded into the capacitor seat 512 together with the first contact terminal 541 and the second contact terminal 551. Meanwhile, the first contact terminal 541 is in contact with the positive terminal of the capacitor 530 in the capacitor seat 512, and the second contact terminal 551 is in contact with the negative terminal of the capacitor 530.

In addition, since the transverse extension portion 543 of the positive copper plate 540 overlaps with the connecting flat surface of the capacitor holder 520, the first heat dissipation holes 546 on the transverse extension portion 543 are connected to the second heat dissipation holes 526 of the positive copper plate 540 to form heat dissipation through holes, so the capacitors 530 can have access to the exterior to realize heat dissipation.

Embodiment of the Manufacturing Method of the Capacitor Array

The manufacturing method of the capacitor array is shown in FIG. 7 and FIG. 11. First, a capacitor holder 520 is taken as a mounting foundation, the positive copper plate 540 is engaged with the first mounting groove 523 of the transverse plate, and the negative copper plate 550 is engaged to the second mounting groove 527 for location.

Then, the locating pin 560 passes through the first location hole 544, the second location hole 553, and the third location hole 524, so the fixation of the positive copper plate 540, the negative copper plate 550, and the transverse plate 522 is enhanced.

After that, one or more capacitors 530 are mounted inside the capacitor groove 521 of the capacitor holder 520 and elastically clamped by the positive copper plate 540 and the negative copper plate 550 to complete the connection of the positive and negative terminals.

Subsequently, the capacitor cover 510 is assembled with the capacitor holder 520 to shield the capacitors 530.

Figure 12:
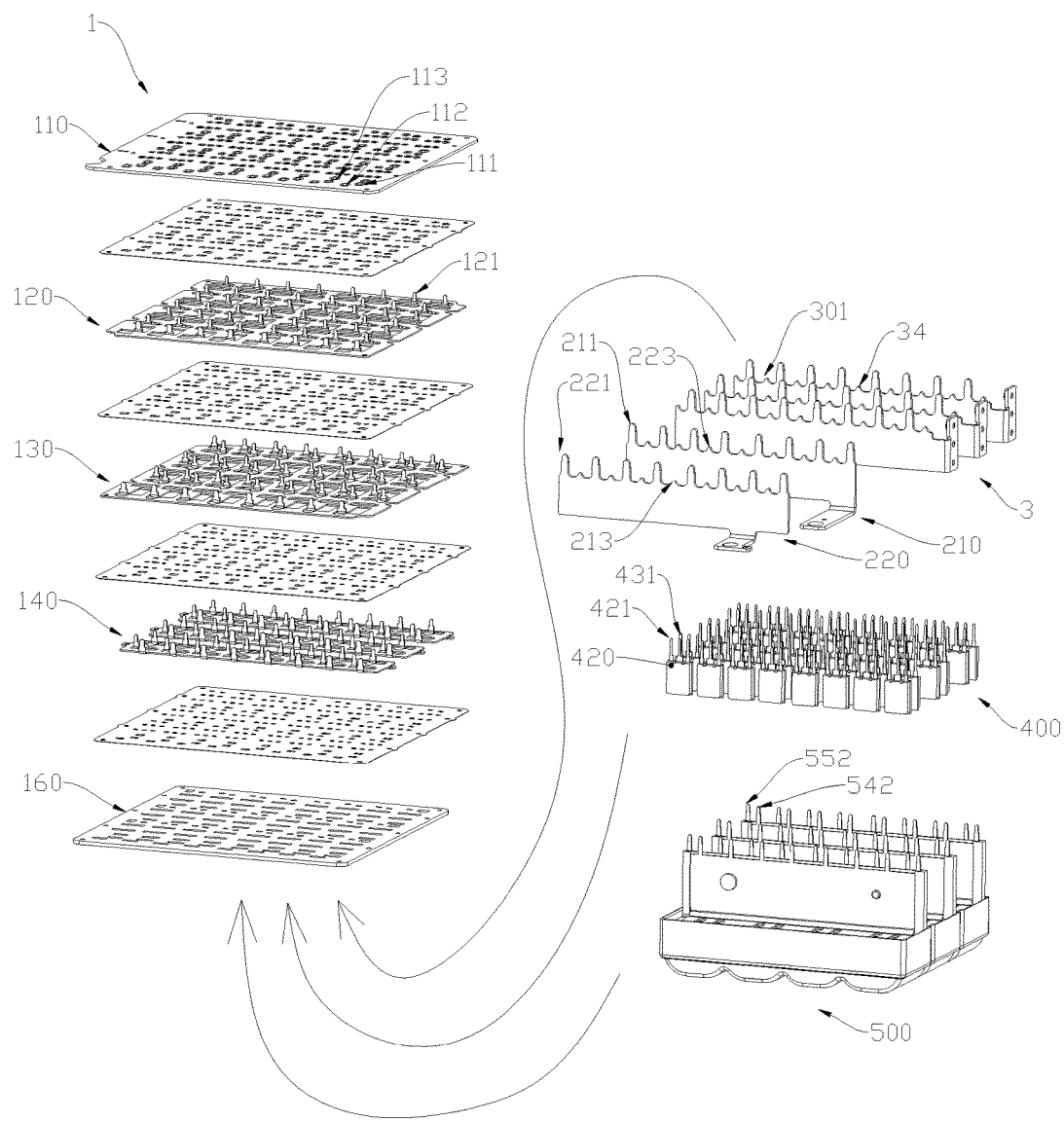
FIG. 12 is another exploded view showing the structure of the AC motor controller according to an embodiment of the present invention.
Figure 14:
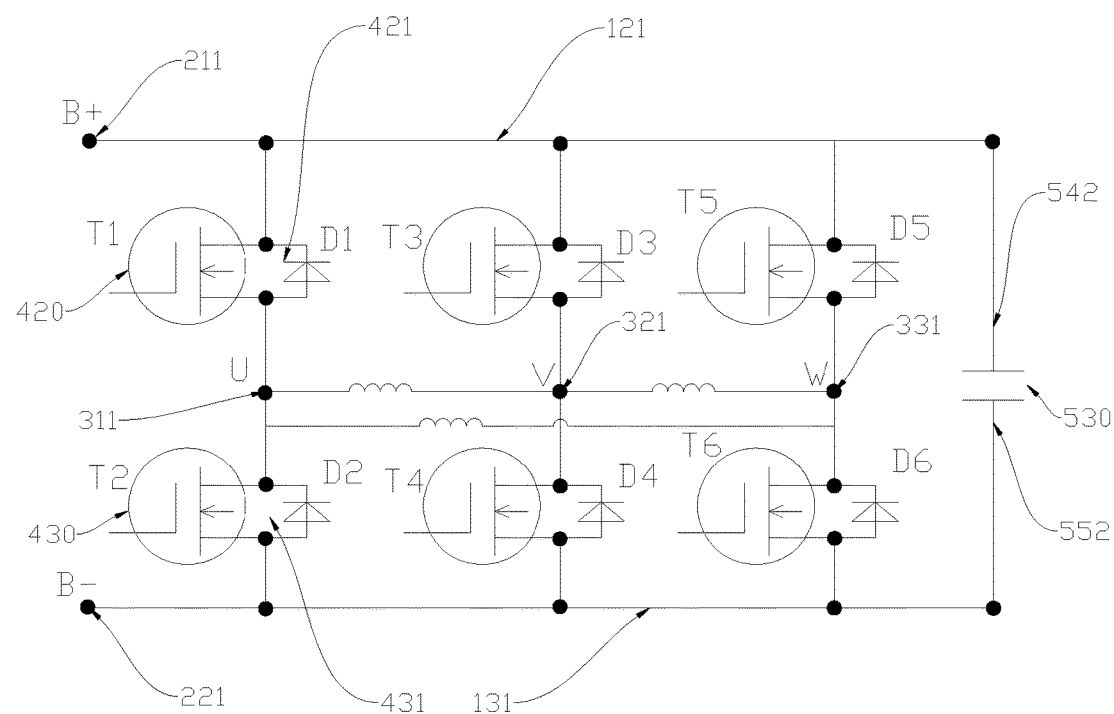
FIG. 14 is an electrical schematic view of the AC motor controller according to an embodiment of the present invention.

Referring to FIG. 1, FIG. 12, and FIG. 14, FIG. 12 is an exploded view showing the structure of the AC motor controller. Since the first pad holes 111, the second pad holes 112, and the third pad holes 113 of the substrate 110 are aligned in rows, and the fourth pins 211 of the positive bus plate 210, the fifth pins 221 of the negative bus plate 220, the sixth pins 301 of the output bus plate 3, the seventh pins 421 and the eighth pins 431 of the combined power transistor module 400, and the first pole pins 542 and the second pole pins 552 of the capacitor array 500 are all aligned in rows. The fourth pins 211, the fifth pins 221, the sixth pins 301, the seventh pins 421, the eighth pins 431, the first pole pins 542, and the second pole pins 552 may all pass through the avoiding hole group on the laminated busbar assembly, and finally reach and pass through the pad hole group to realize the required electrical connection with the first connecting part of the first pins 121, the second connecting part of the second pins 131, or the third connecting part of the third pins 141.

Figure 13:
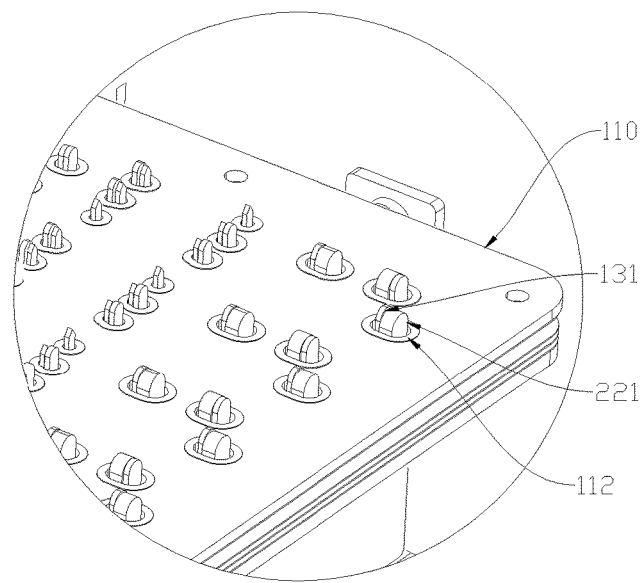
FIG. 13 is a partially enlarged view of A in FIG. 1.

Referring to FIG. 12 and FIG. 13, FIG. 13 is a partially enlarged view of FIG. 1. Taking the fifth pin 221 of the negative bus plate 220 as an example, the fifth pin 221 passes through the avoiding hole groups of the insulation plate 160, the output current metal plate 140, negative current metal plate 130, and the positive current metal plate 120, then passes through the second pad hole 112 of the substrate 110 at last to adjoin the second connecting part of the second pin 131 which originally passes through the second pad hole 112. The pad holes 112 are in interference fit with both of the second pins 131 and the fifth pins 221. The first protrusion portion 213, the second protrusion portion 223 and the third protrusion portion 34 all abut against the insulation plate 160. Under the abutting action of the first protrusion portion 213, the second protrusion portion 223, and the third protrusion portion 34, and the action of the interference fit of the fourth pin 211, the fifth pin 221, and the sixth pin 301 with the substrate 110, the position of each metal plate located between the insulation plate 160 and the substrate 110 is more fixed and unlikely to warp, so rosin joint of the soldering can be prevented, and the structure of the laminated busbar assembly is more compact.

Similarly:

The fourth pin 211 passes through the first pad hole 111 to adjoin the first connecting part of the first pad 121 therein and be fixed. The sixth pin 301 passes through the third pad hole 113 to adjoin the third connecting part of the third pin 141 and be fixed.

Combined power transistor assembly 400:

The first power transistor 420 is served as the first controllable switching element and connected between the positive input terminal and the three-phase output terminal. The first seventh pin 421 of the first power transistor 420 passes through the first pad hole 111 to adjoin the first connecting part of the first pin 121 therein and is fixed. The second seventh pin 421 of the first power transistor 420 passes through the third pad hole 113 to adjoin the third connecting part of the third pin 141 therein and is fixed.

The second power transistor 430 is served as the second controllable switching element and connected between the negative input terminal and the three-phase output terminal. The first eighth pin 431 of the second power transistor 430 passes through the second pad hole 112 to adjoin the second connecting part of the second pin 131 therein and is fixed. The second eighth pin 431 of the second power transistor 430 passes through the third pad hole 113 to adjoin the third connecting part of the third pin 141 therein and is fixed.

Capacitor Array 500:

The capacitor array is served as a filter assembly and connected between the positive input terminal and the negative input terminal. The first pole pin 542 passes through the first pad hole 111 to adjoin the first connecting part of the first pin 121 therein and is fixed. The second pole pin 552 passes through the second pad hole 112 to adjoin the second connecting part of the second pin 131 therein and is fixed.

In the production procedure of the AC motor controller in this embodiment, since the pins of the circuit element 2, input bus plate 3, and output bus plate 4 all pass through the pad holes from the first side of the substrate 110, one merely to place the input bus plate 3, the output bus plate 4 and the combined power transistor assembly 400, and the capacitor array 500 and then compress the pins of the components to pass through the pad hole group of the substrate 110 in one time. Then the tin soldering process is performed on the protruding connecting parts at the second side of the substrate 110 and pins in one-off manner, in that way the processing and production of the AC motor controller is completed efficiently and quickly. Similarly, the laminated busbar assembly is also applicable to other electronic control devices excluding the AC motor controller.

Referring to FIG. 14, FIG. 14 is an electrical schematic view of the AC motor controller. The power unit is provided with two DC power supply terminals including a positive DC power supply terminal B+ and a negative DC power supply terminal B−, which respectively receive the positive direct current and negative direct current output by the storage battery. The power unit is provided with three current output terminals, which respectively correspond to the three phases of U, V, W of the motor, and are used to output current to the three-phase of the motor.

The first pin 121 and the seventh pin 421 of the first power transistor 420 are both connected to the positive DC power supply terminal B+. The first pole pin 542 of the capacitor 530 is connected to the positive DC power supply terminal B+.

The second pin 131 and the drain terminal of the eighth pin 431 of the second power transistor 430 are both connected to the negative DC power supply terminal B−. The second pole pin 552 of the capacitor 530 is connected to the negative DC power supply terminal B−.

Three drain terminals of seventh pins 421 are connected to three phases U, V, and W, respectively. Three source terminals of eighth pins 431 are connected to three phases U, V, and W, respectively. The U-phase sixth pin 311 is at U-phase. The V-phase sixth pin 321 is at V-phase. The W-phase sixth pin 331 is at W-phase.

Embodiment of the Manufacturing Method of the Laminated Busbar Assembly:

Referring to FIGS. 4 and 12, FIG. 12 is an exploded view showing the structure of an AC motor controller based on the laminated busbar assembly 1. Since the structure of the laminated busbar assembly 1 is described in detail when the first and second objectives of the present invention are described, and the AC motor controller is based on the laminated busbar assembly 1, the steps of the manufacturing method of the AC motor controller is explained as follows.

Taking substrate 110 as a foundation of the processing, first insulation piece 151 is laminated on the first side (lower side shown in FIG. 12) of the substrate 110, and the positive current metal plate 120 is laminated under the first insulation piece 151. The first pin 121 of the positive current metal plate 120 passes through the avoiding hole group of the first insulation piece 151, and finally passes through the first pad hole 111 of the substrate 110.

Second insulation piece 152 is laminated under the positive current metal plate 120, and the negative current metal plate 130 is laminated under the second insulation piece 152. The second pin 131 of the negative current metal plate 130 passes through the avoiding hole groups of the second insulation piece 152, the positive current metal plate 120, and the first insulation piece 151, and finally passes through the second pad hole 112 of the substrate 110.

Third insulation piece 153 is laminated under the negative current metal plate 130, and the output current metal plate 140 is laminated under the third insulation piece 153. The third pin 141 of the output current metal plate 140 passes through the avoiding hole groups of the third insulation piece 153, the negative current metal plate 130, the second insulation piece 152, the positive current metal plate 120, and the first insulation piece 151, and finally passes through the third pad hole 113 of the substrate 110.

Fourth insulation piece 154 is laminated under the output current metal plate 140, and insulation plate 160 is laminated under the fourth insulation piece 154.

Input bus plate 2 is arranged under the insulation plate 160, and the fourth pin 211 and the fifth pin 221 of the input bus plate 2 pass through the avoiding hole group of the laminated busbar assembly 1 and then pass through the pad hole group.

Output bus plate 3 is arranged under the insulation plate 160, and the sixth pin 301 passes through the avoiding hole group of the laminated busbar assembly 1 and then passes through the pad hole group.

Combined power transistor module 400 is configured under the insulation plate 160, and the seventh pin 421 and the eighth pin 431 of the combined power transistor module 400 pass through the avoiding hole group of the laminated busbar assembly 1 and then pass through the pad hole group.

Capacitor array 500 is configured under the insulation plate 160, and the first pole pin 542 and second pole pin 552 pass through the avoiding hole group of the laminated busbar assembly 1 and then pass through the pad hole group.

The laminated busbar assembly 1, the combined power transistor module 400, and the capacitor array 500 assembled together are subjected to reflow soldering. Meanwhile, respective pins and the substrate 110 are connected according to the wirings of the electrical schematic diagram shown in FIG. 14 to form a circuit.

To conclude, it should be noted that the above descriptions are merely the preferred embodiments of the present invention and are not intended to limit the present invention. For those skilled in the art, the present invention may have various changes and variations, for example, the laminating order of the positive current metal plate 120, the negative current metal plate 130, and the output current metal plate 140 can be interchanged, or equivalent interchanges such as: the lateral side of the transverse plate 522 is changed from the first end of the capacitor groove 521 to the second end of the capacitor groove 521, thereby the transverse extension portion 543 is transferred from the positive copper plate 540 to the negative copper plate 550 etc. Any modification, equivalent substitution, improvement, etc. derived within the spirit and principles of the present invention shall be considered as fall within the scope of the present invention.

The AC motor controller, the laminated busbar assembly, and the manufacturing method thereof of the present invention are applicable to electrical applications. When the products and methods of the present invention are applied, the processing of the AC transformer is completed by two steps: passing the first pin of the positive current metal plate, the second pin of the negative current metal plate, the third pin of the output current metal plate, the controllable switching element assembly, and the filter element assembly through the pad hole group of the substrate, and then performing soldering in one-off manner, so the production is efficient and has good expansibility.

What is claimed is:

1. A laminated busbar assembly, comprising:
    a substrate, wherein the substrate is provided with a pad hole group, the pad hole group is electrically connected to copper pour in the substrate to form wirings, the pad hole group comprises a first pad hole, a second pad hole, and a third pad hole;
    a positive current metal plate, wherein the positive current metal plate is provided with a first pin, the positive current metal plate is arranged on a first side of the substrate, the first pin passes through the first pad hole, and a first connecting part is configured at a second side of the substrate by the first pin;
    a negative current metal plate, wherein the negative current metal plate is provided with a second pin, the negative current metal plate is arranged on the first side of the substrate, the second pin passes through the second pad hole, and a second connecting part is configured at the second side of the substrate by the second pin; and
    an output current metal plate, wherein the output current metal plate is provided with a third pin, the output current metal plate is arranged on the first side of the substrate, the third pin passes through the third pad hole, and a third connecting part is configured at the second side of the substrate by the third pin;
    wherein the substrate, the positive current metal plate, the negative current metal plate, and the output current metal plate are arranged in a laminated manner, the first connecting part is connected to the third connecting part, the second connecting part is connected to the third connecting part, and the first connecting part is connected to the second connecting part.

2. The laminated busbar assembly according to claim 1, further comprises
    an insulation layer group, the insulation layer group is arranged on a side of each of the substrate, the positive current metal plate, the negative current metal plate, and the output current metal plate.

3. The laminated busbar assembly according to claim 2 further comprising an avoiding hole group, wherein the avoiding group is arranged on each of the positive current metal plate, the negative current metal plate, the output current metal plate, and the insulation layer group;
    the first pin, the second pin, and the third pin pass through the avoiding hole group.

4. The laminated busbar assembly according to claim 3 further comprising an insulation plate, wherein the insulation plate, the substrate, the positive current metal plate, the negative current metal plate, the output current metal plate, and the insulation layer group are arranged in the laminated manner, and the insulation plate is located at an outermost end away from the substrate; and the avoiding hole group is also arranged on the insulation plate.

5. The laminated busbar assembly according to claim 4, wherein
the first pin, the second pin, and the third pin are arranged on a side of the avoiding hole group.

6. The laminated busbar assembly according to claim 5 further comprising:
a positive bus plate, wherein the positive bus plate is provided with a fourth pin, the fourth pin passes through the first pad hole and adjoins the first connecting part;
a negative bus plate, wherein the negative bus plate is provided with a fifth pin, the fifth pin passes through the second pad hole and adjoins the second connecting part; and
an output bus plate, wherein the output bus plate is provided with a sixth pin, the sixth pin passes through the third pad hole and adjoins the third connecting part.

7. The laminated busbar assembly according to claim 6, wherein
the fourth pin and the first pad hole are in an interference fit;
the fifth pin and the second pad hole are in an interference fit; and
the sixth pin and the third pad hole are in an interference fit.

8. The laminated busbar assembly according to claim 4 further comprising:
a positive bus plate, wherein the positive bus plate is provided with a fourth pin, the fourth pin passes through the first pad hole and adjoins the first connecting part;
a negative bus plate, wherein the negative bus plate is provided with a fifth pin, the fifth pin passes through the second pad hole and adjoins the second connecting part; and
an output bus plate, wherein the output bus plate is provided with a sixth pin, the sixth pin passes through the third pad hole and adjoins the third connecting part.

9. The laminated busbar assembly according to claim 8, wherein
the fourth pin and the first pad hole are in an interference fit;
the fifth pin and the second pad hole are in an interference fit; and
the sixth pin and the third pad hole are in an interference fit.

10. The laminated busbar assembly according to claim 3 further comprising:
a positive bus plate, wherein the positive bus plate is provided with a fourth pin, the fourth pin passes through the first pad hole and adjoins the first connecting part;
a negative bus plate, wherein the negative bus plate is provided with a fifth pin, the fifth pin passes through the second pad hole and adjoins the second connecting part; and
an output bus plate, wherein the output bus plate is provided with a sixth pin, the sixth pin passes through the third pad hole and adjoins the third connecting part.

11. The laminated busbar assembly according to claim 10, wherein
the fourth pin and the first pad hole are in an interference fit;
the fifth pin and the second pad hole are in an interference fit; and
the sixth pin and the third pad hole are in an interference fit.

12. The laminated busbar assembly according to claim 2 further comprising an avoiding hole group, wherein the avoiding group is arranged on the positive current metal plate, the negative current metal plate, the output current metal plate, or the insulation layer group;
the first pin, the second pin, or the third pin passes through the avoiding hole group.

13. The laminated busbar assembly according to claim 2 further comprising:
a positive bus plate, wherein the positive bus plate is provided with a fourth pin, the fourth pin passes through the first pad hole and adjoins the first connecting part;
a negative bus plate, wherein the negative bus plate is provided with a fifth pin, the fifth pin passes through the second pad hole and adjoins the second connecting part; and
an output bus plate, wherein the output bus plate is provided with a sixth pin, the sixth pin passes through the third pad hole and adjoins the third connecting part.

14. The laminated busbar assembly according to claim 13, wherein
the fourth pin and the first pad hole are in an interference fit;
the fifth pin and the second pad hole are in an interference fit; and
the sixth pin and the third pad hole are in an interference fit.

15. The laminated busbar assembly according to any of claim 1 further comprising:
a positive bus plate, wherein the positive bus plate is provided with a fourth pin, the fourth pin passes through the first pad hole and adjoins the first connecting part;
a negative bus plate, wherein the negative bus plate is provided with a fifth pin, the fifth pin passes through the second pad hole and adjoins the second connecting part; and
an output bus plate, wherein the output bus plate is provided with a sixth pin, the sixth pin passes through the third pad hole and adjoins the third connecting part.

16. The laminated busbar assembly according to claim 15, wherein
the fourth pin and the first pad hole are in an interference fit;
the fifth pin and the second pad hole are in an interference fit; and
the sixth pin and the third pad hole are in an interference fit.

17. The laminated bus bar assembly according to claim 16, wherein
the positive bus plate is provided with a first protrusion portion located between the fourth pin;
the negative bus plate is provided with a second protrusion portion located between the fifth pin;
the output bus plate is provided with a third protrusion portion located between the sixth pin.

18. The laminated busbar assembly according to claim 1, wherein
the laminated busbar assembly further comprises an insulation layer group, the insulation layer group is arranged on a side of the substrate, the positive current metal plate, the negative current metal plate, or the output current metal plate.

* * * * *